United States Patent
Lin et al.

(10) Patent No.: US 8,999,770 B2
(45) Date of Patent: Apr. 7, 2015

(54) SYSTEMS AND METHODS PROVIDING SEMICONDUCTOR LIGHT EMITTERS

(71) Applicant: TSMC Solid State Lighting Ltd., Hsinchu (TW)

(72) Inventors: Tien-Ming Lin, Hsinchu (TW); Chih-Hsuan Sun, Kaohsiung (TW); Wei-Yu Yeh, Tainan (TW)

(73) Assignee: TSMC Solid State Lighting Ltd., Hsin-Chu (TW)

( * ) Notice: Subject to any disclaimer, the term of this patent is extended or adjusted under 35 U.S.C. 154(b) by 0 days.

(21) Appl. No.: 13/949,556

(22) Filed: Jul. 24, 2013

(65) Prior Publication Data

US 2013/0309790 A1 Nov. 21, 2013

Related U.S. Application Data

(63) Continuation of application No. 13/117,320, filed on May 27, 2011, now Pat. No. 8,507,328.

(51) Int. Cl.
*H01L 21/20* (2006.01)
*H01L 33/58* (2010.01)
*H01L 33/50* (2010.01)

(52) U.S. Cl.
CPC .............. *H01L 33/58* (2013.01); *H01L 33/507* (2013.01); *H01L 2933/0041* (2013.01); *H01L 2933/0058* (2013.01); *H01L 2924/0002* (2013.01); *H01L 2224/48091* (2013.01)

(58) Field of Classification Search
USPC ................... 257/E21.352, E21.366, E21.053, 257/E21.499, E21.527, E21.617; 438/141, 438/27, 65, 91, 30, 69, 70, 82, 75, 99
See application file for complete search history.

(56) References Cited

U.S. PATENT DOCUMENTS

| 8,507,328 B2 * | 8/2013 | Lin et al. ..................... 438/141 |
| 2011/0227487 A1 | 9/2011 | Nichol et al. |
| 2012/0119228 A1 | 5/2012 | Hsia et al. |
| 2012/0129282 A1 | 5/2012 | Hsia et al. |

OTHER PUBLICATIONS

Hsing-Kuo Hsia and Chih-Kuang Yu, U.S. Appl. No. 13/005,731, filed Jan. 13, 2011, for "Micro-Interconnects for Light-Emitting Diodes," 19 pages of text, 6 pages of drawings.
Hsing-Kuo Hsia and Chih-Kuang Yu, U.S. Appl. No. 13/094,344, filed Apr. 26, 2011, for "Method and Structure for LED With Nano-Patterned Substrate," 22 pages of text, 6 pages of drawings.
Hsing-Kuo Hsia; Chih-Kuang Yu; Hung-Yi Kuo; Hung-Wen Huang U.S. Appl. No. 12/951,662, filed Nov. 22, 2010, for "Wafer Level Conformal Coating for LED Devices," 17 pages of text, 8 pages of drawings.
Hsing-Kuo Hsia; Chih-Kuang Yu; Gordon Kuo; Chyi-Shyuan Chern, U.S. Appl. No. 12/944,895, filed Nov. 12, 2010, for "LED Device With Improved Thermal Performance," 19 pages of text, 8 pages of drawings.
Harry Hsia; Albert W.Y. Liu, Leuh Fang and Samuel C. Chen, U.S. Appl. No. 61/247,813, filed Oct. 1, 2009, for "Method and Apparatus of Fabricating an Integrated Photonic Device," 26 pages of text, 24 pages of drawings.

* cited by examiner

*Primary Examiner* — David Nhu
(74) *Attorney, Agent, or Firm* — Haynes and Boone, LLP (57) ABSTRACT

A semiconductor structure includes a module with a plurality of die regions, a plurality of light-emitting devices disposed upon the substrate so that each of the die regions includes one of the light-emitting devices, and a lens board over the module and adhered to the substrate with glue. The lens board includes a plurality of microlenses each corresponding to one of the die regions, and at each one of the die regions the glue provides an air-tight encapsulation of one of the light-emitting devices by a respective one of the microlenses. Further, phosphor is included as a part of the lens board.

20 Claims, 12 Drawing Sheets

FIG. 10 side view top view

SYSTEMS AND METHODS PROVIDING SEMICONDUCTOR LIGHT EMITTERS

PRIORITY DATA

This application is a continuation application of U.S. patent application Ser. No. 13/117,320, filed on May 27, 2011, entitled "SYSTEMS AND METHODS PROVIDING SEMICONDUCTOR LIGHT EMITTERS," now U.S. Pat. No. 8,507,328 issued on Aug. 13, 2013 the disclosure of which is hereby incorporated by reference in its entirety

TECHNICAL FIELD

The present disclosure relates generally to a semiconductor device, and more particularly, to semiconductor light emitters and methods of fabricating semiconductor light emitters.

BACKGROUND

The semiconductor integrated circuit (IC) industry has experienced rapid growth. Technological advances in IC materials and design have produced generations of ICs where each generation has smaller and more complex circuits than the previous generation. These ICs include semiconductor light-emitting devices, such as Light Emitting Diodes (LEDs).

Traditional methods of fabricating the semiconductor light-emitting devices focus on manufacturing LEDs one-by one. A manufacturing entity receives a multitude of individual LED dies. Wire bonding is used to electrically connect each of the LEDs to contacts on their respective dies. Phosphor glue is mixed by hand and then applied to the LEDs one-by-one. Lenses are then molded over each of the LEDs to encapsulate the LEDs, and the lenses can be made of an optical glue.

The aforementioned process has some disadvantages. In one aspect, the one-by-one nature of the process can be quite inefficient and may result in very long manufacturing times for a batch of LED devices. Also, the hand-mixing step for the phosphor glue can be a relatively costly manufacturing process. Additionally, when the phosphor is very close to (or in contact with) an LED, it can experience thermal wear over time that can lower phosphor thermal efficiency. Therefore, while existing methods of fabricating light-emitting devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 9 is a side view illustration of a die with a plastic microlens placed thereon according to one embodiment; FIG. 9 also illustrates a glue layer according to one embodiment;

SUMMARY

In one embodiment, a process for manufacturing semiconductor emitters includes providing a module that includes a substrate with a plurality of light-emitting devices disposed thereon, providing a lens board that has a plurality of transparent microlenses, in which phosphor is included as a part of the lens board, placing an optical glue on each of the microlenses, and aligning the lens board and the module using alignment marks on the lens board and the module. The aligning performed so that each one of the microlenses is aligned with a respective one of the light-emitting devices. The process also includes adhering the lens board to the module so that the optical glue prevents air gaps between the each of the light-emitting devices and the respective micro lenses.

In another embodiment, a semiconductor structure includes a module with a plurality of die regions, a plurality of light-emitting devices disposed upon the substrate so that each of the die regions includes one of the light-emitting devices, and a lens board over the module and adhered to the substrate with glue. The lens board includes a plurality of microlenses each corresponding to one of the die regions, and at each one of the die regions the glue provides an air-tight encapsulation of one of the light-emitting devices by a respective one of the microlenses. Further, phosphor is included as a part of the lens board.

In yet another embodiment, a process for manufacturing a plurality of semiconductor emitters includes providing a lens board that has a plurality of lenses, applying transparent optical glue to each of the lenses, and drawing an adherent glue on a substrate, where the substrate has a plurality of light-emitting devices thereon. The adherent glue is drawn between adjacent ones of the light-emitting devices. The process also includes adhering the lens board to the substrate so as to eliminate air bubbles between each of the light-emitting devices and corresponding lenses.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Various embodiments described below include LED devices that have phosphor material remote from the LEDs themselves. Other embodiments include methods for manufacturing the LED devices. In one example, a plastic microlens has a phosphor material in the plastic material of the microlens or coated on the plastic material. The plastic microlens forms the outer structure of the LED package. The plastic microlens encapsulates the LED, where optical glue fills in the volume between the LED and the plastic microlens. During operation, light produced by the LED passes through the plastic material and the phosphor material before it escapes the package. The phosphor changes the light of the LED into a broader spectrum of white light (or other color, if desired). Such embodiments are described in more detail below.

Additionally, other embodiments include methods for manufacturing the LED devices. A lens board is formed of plastic material, where the lens board has multiple microlenses, and the plastic material of the lens board includes phosphor material therein or thereon. In this example, the lens board conforms to a semiconductor LED module that has a plurality of LED die regions so that the number and spacing of the microlenses corresponds to the number and spacing of the LED die regions.

Each of the microlenses is a relatively thin, concave structure. Optical glue is applied to the microlenses to fill the concave structures. The lens board is then adhered to the LED module, and the LED module/lens board structure can be diced to produce multiple LED devices.

In another example, a wafer-level structure is manufactured using the process described immediately above. A LED module with a plurality of die regions is manufactured or, in some instances, received from a manufacturer. A plastic lens board is also either manufactured or received. Phosphor material is embedded in the material of the lens board or is applied onto the lens board. In one example, the lens board is injection molded with the phosphor material mixed in with the plastic before the injection molding process takes place. In another example, the lens board is produced, and then a later step applies the phosphor material to concave surfaces of the microlenses of the lens board using, e.g., a spraying process.

Optical glue is then applied to the lens board by, e.g., pouring the optical glue into the individual microlens structures. The lens board is then aligned with the LED module so that the individual microlenses line up with respective, corresponding LED die regions. In one example, the alignment process uses alignment marks on the lens board and on the LED module, where an optical or infrared technique lines up the lens board and the LED module with a high level of precision. The structure is a wafer-level structure that has an LED module covered by a lens board, the lens board being adhered to the LED module. Each of the multiple, individual LEDs is encapsulated by a respective microlens. The structure can then the diced to produce individual LED packages. Example embodiments are described in more detail below.

Figure 1:
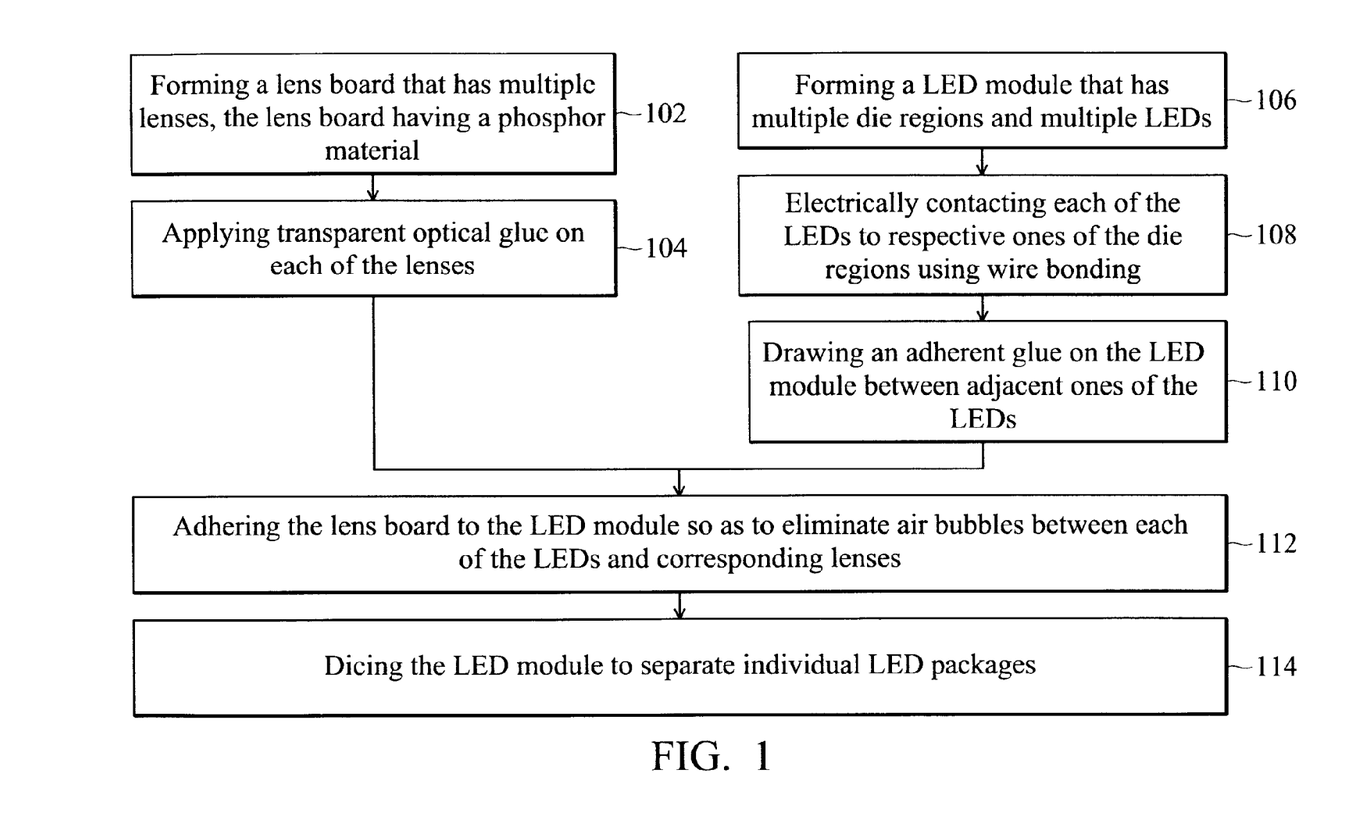
FIG. 1 is a flowchart of a method for fabricating semiconductor light-emitting devices according to one embodiment.

Illustrated in FIG. 1 is a flowchart of a method 100 for fabricating semiconductor light-emitting devices. FIGS. 2-12 are diagrammatic views of the semiconductor light-emitting devices and other components during various fabrication stages. Each of the LED die regions may include more than just an LED. In some examples, the LED module has various passive and active structures formed therein that interact with LEDs (e.g., LED driver circuits) and/or interact with other circuits outside of the LED packages. It is understood that FIGS. 1-12 have been simplified for a better understanding of the inventive concepts of the present disclosure. Accordingly, it should be noted that additional processes may be provided before, during, and after the method 100 of FIG. 1, and that some other processes may only be briefly described herein.

Referring to FIG. 1, blocks 102 and 104 refer to fabricating and preparing the lens board that is adhered to the LED module. Blocks 106-110 refer to fabrication and preparation of the LED module. The actions of fabricating and preparing the lens board (blocks 102, 104) may be performed concurrently or sequentially with the actions for fabrication and preparation of the LED module (blocks 106-110). The focus of FIG. 1 is on wafer-level activities, in contrast to conventional process that fabricate LED packages one-by-one.

Figure 2:
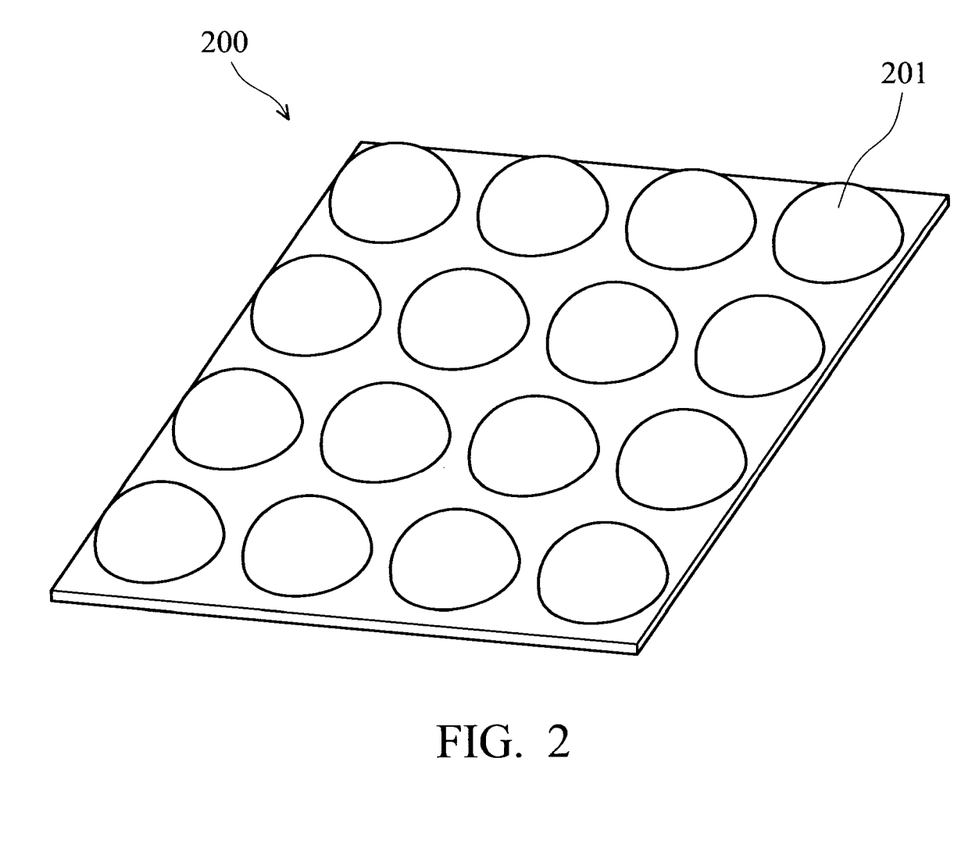
FIG. 2 shows an exemplary lens mold adapted according to one embodiment.

In block 102, a lens board is formed that has multiple lenses thereon. FIG. 2 shows an exemplary lens board 200 adapted according to one embodiment. Lens board 200 includes multiple microlenses, exemplified by microlens 201. Furthermore, the lens board material includes a phosphor material distributed within the lens material or applied onto the lens material. In one example, the lens board is made of polycarbonate plastic with phosphor distributed within it. The phosphor and polycarbonate is injection molded to form the lens board. In the present embodiments, the phosphor material transforms the color of the light emitted by an LED. For example, in one embodiment, the phosphor material transforms a blue light emitted by an LED into a white light, and other color examples are within the scope of embodiments.

In this example, phosphor particles are added to the polycarbonate when the polycarbonate is melted, and the phosphor particles are mixed uniformly with the polycarbonate material. The polycarbonate material may be stirred during and/or after the phosphor particles are added so as to increase the uniformity of the distribution of the phosphor particles within the polycarbonate material.

The phosphor particles are made of a phosphor material, which can be used to exhibit luminescence. Phosphor materials may include both phosphorescent materials and fluorescent materials. In practical LED applications, the phosphor material may be used to transform the color of the light emitted by an LED device. For example, in an embodiment, the phosphor particles may transform a blue light emitted by the LED into a white light. By changing the material composition of the phosphor particles, any of a variety of desired light colors emitted by the device may be achieved.

Figure 3:
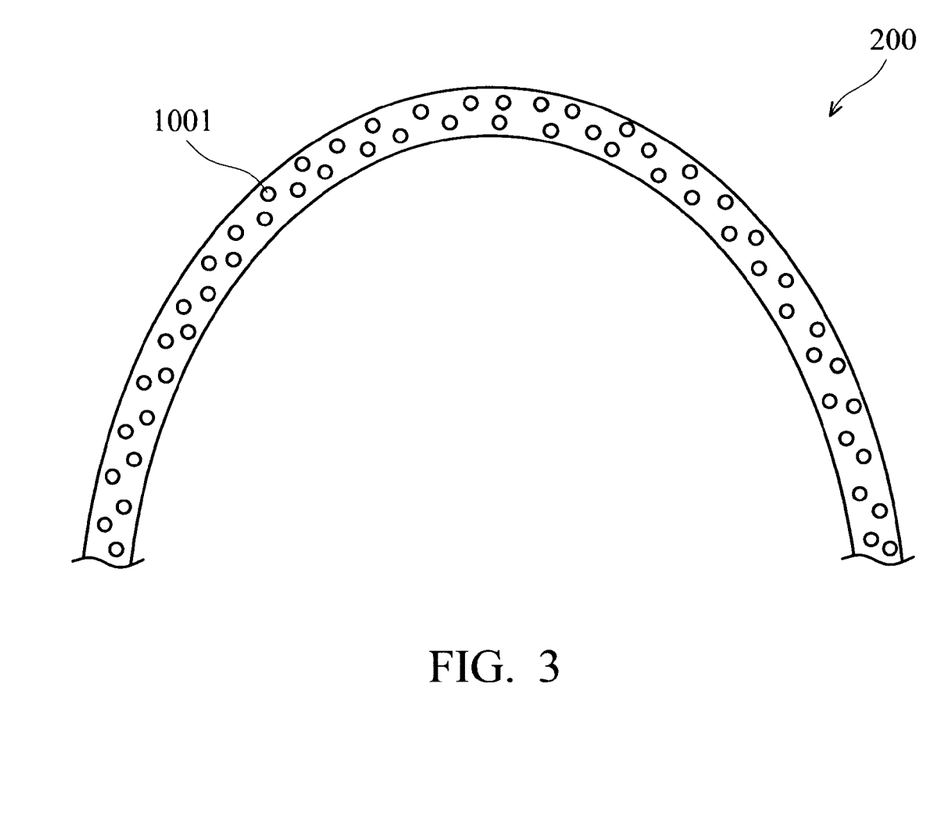
FIG. 3 shows an exemplary cross-sectional view of a single microlens to illustrate phosphor distribution within a plastic material of a microlens according to one embodiment.

FIG. 3 is an illustration of a single-lens portion of lens board 200, according to one embodiment, shown in cross-section. The material of lens board 200 includes a plastic material, such as polycarbonate, with phosphor particles (exemplified by phosphor particle 1001) mixed therein. The phosphor particles may have different sizes and shapes. For example, the phosphor particles may follow an approximately Gaussian distribution (or another random distribution) in terms of their sizes, may be nearly uniform in size, or may exhibit another non-random distribution. For purposes of simplicity, however, the sizes, shapes, and amount of the phosphor particles may not be reflected accurately in FIG. 3 or the following figures.

In another example, the phosphor material may be applied to a surface of lens board 200 rather than, or in addition to, being mixed within the material of the lens board. In this example, phosphor coating may be deposited using a mask or through screen printing to form a surface phosphor layer to only cover some portions of lens board 200 while leaving other portions not covered. Alternatively, phosphor coating may be deposited through a spray process to form a conformal phosphor layer to cover substantially all, or a large portion of, lens board 200.

Polycarbonate is not the only material that can be used in various embodiments to form the lens board. Other embodiments may use any optical-grade material in which phosphor can be distributed. Examples include polymethylmethacrylate (PMMA), acrylonitrile butadiene styrene (ABS), polyamide (PA), and the like.

Figure 4:
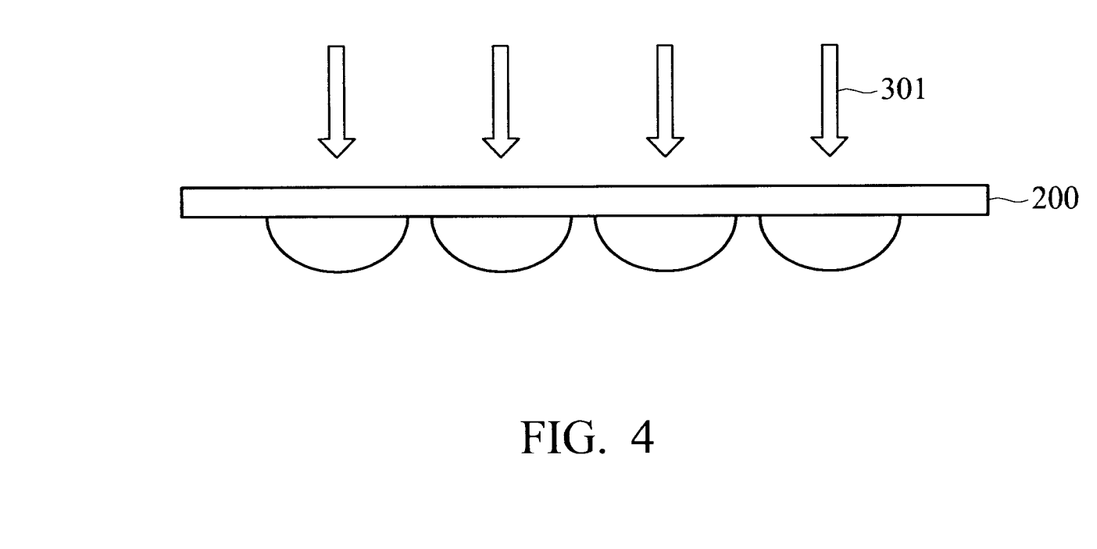
FIG. 4 shows an example of applying optical glue to a lens mold according to one embodiment.

Returning to FIG. 1, in block 104, transparent optical glue is applied to the lens board by pouring, though other methods of applying glue (e.g., spin coating and printing) can also be used. The transparent optical glue is applied in an amount that is enough to eliminate air bubbles at block 112 but no so much that excess glue affects ease of manufacturing. Any appropriate optical grade glue may be used. In one example, the optical glue has an index of refraction between 1.4 and 1.8, though the scope of embodiments is not so limited. FIG. 4 shows an example of applying optical glue 301 to lens board 200 in block 104.

At block 106 (FIG. 1), a LED module is formed that has multiple die regions and LEDs upon a substrate. The substrate defines multiple die regions. After dicing or cutting in subsequent steps, each of the die regions corresponds to one die, and each die region may include one or more LED devices. The die regions and LEDs can be formed using any semiconductor manufacturing processes now known or later developed. For instance, the substrate may be a silicon (Si) wafer or a portion of a Si wafer, and conventional Si processing methods are applied. In another example, the substrate is ceramic, and the die regions and LEDs are mounted or manufactured onto the ceramic.

Figure 5:
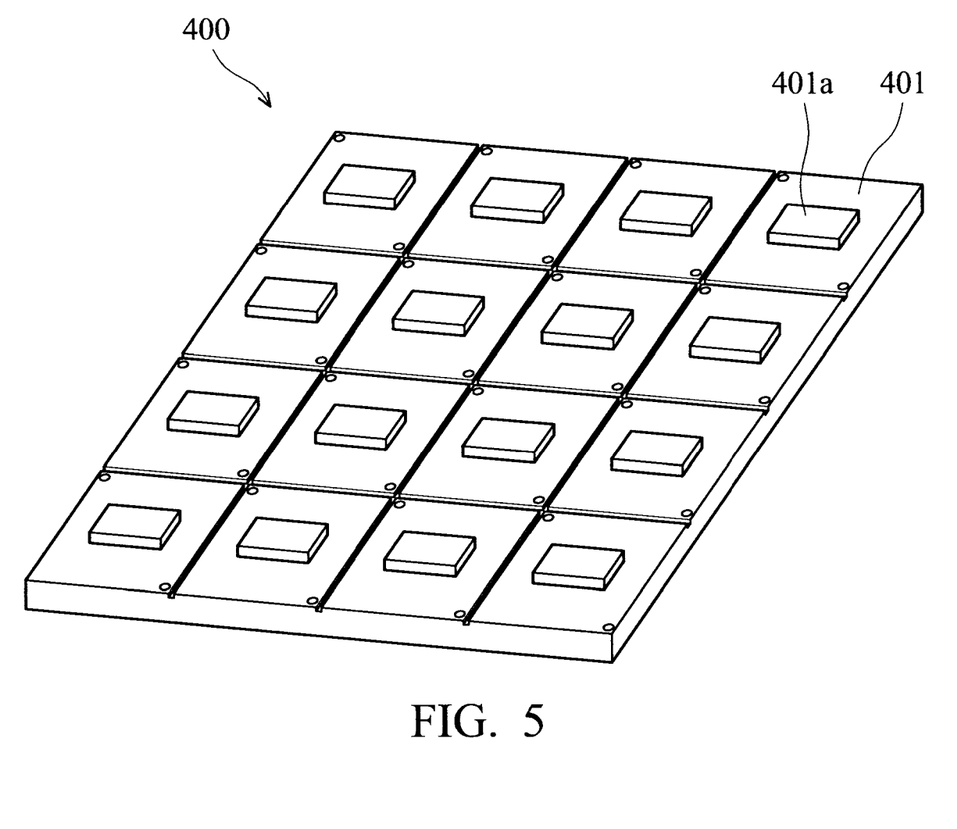
FIG. 5 is an illustration of an exemplary LED module, adapted according to one embodiment.

FIG. 5 is an illustration of exemplary LED module 400, adapted according to one embodiment. It is understood that FIGS. 4 and 5 have been simplified for a better understanding of the inventive concepts of the present disclosure, and other embodiments may include more or fewer die regions and/or microlenses.

LED module 400 has a plurality of LED die regions, exemplified by LED die region 401. LED die region 400 corresponds to microlens 201 (FIG. 2) so that when lens board 200 is adhered to LED module 400, microlens 201 encapsulates the LED die region 401. LED module 400 is shown having a rectangular substrate, though other substrates, such as circular substrates may be used on other embodiments. Furthermore, LED modules and lens boards of any size may be used in various embodiments.

LED module 400 includes a plurality of LEDs that are formed or mounted on a substrate. For the sake of providing an example, LED 401*a* is shown disposed upon the substrate, and it is understood that the other LEDs on LED module 400 are similar to the LED 401*a* and are formed or mounted on the same substrate as well. Each of the LEDs (exemplified by LED 401*a*) includes at least one P/N junction formed by oppositely doped layers. In one embodiment, the oppositely doped layers may include oppositely doped gallium nitride (GaN) layers. For example, one of these layers may be doped with an n-type dopant such as carbon or silicon, and the oppositely doped layer is doped with a p-type dopant such as magnesium. In other embodiments, the n-type and p-type dopants may include different materials.

In an embodiment, the LEDs (such as LED 401*a*) may each include a multiple-quantum well (MQW) layer that is disposed in between the oppositely doped layers. The MQW layer may include alternating (or periodic) layers of gallium nitride and indium gallium nitride (InGaN). For example, the MQW layer may include ten (or any other number) layers of gallium nitride and ten (or any other number) layers of indium gallium nitride, where an indium gallium nitride layer is formed on a gallium nitride layer, and another gallium nitride layer is formed on the indium gallium nitride layer, so on and so forth.

The doped layers and the MQW layer may all be formed by an epitaxial growth process or other process known in the art. After the completion of the epitaxial growth process, a P/N junction (or a P/N diode) is formed by the disposition of the MQW layer between the doped layers. When an electrical voltage (or electrical charge) is applied to the doped layers, electrical current flows through the LED, and the MQW layer emits radiation such as light in a visible spectrum. The color of the light emitted by the MQW layer corresponds to the wavelength of the light. The wavelength of the light (and hence the color of the light) may be tuned by varying the composition and structure of the materials that make up the MQW layer.

Figure 6:
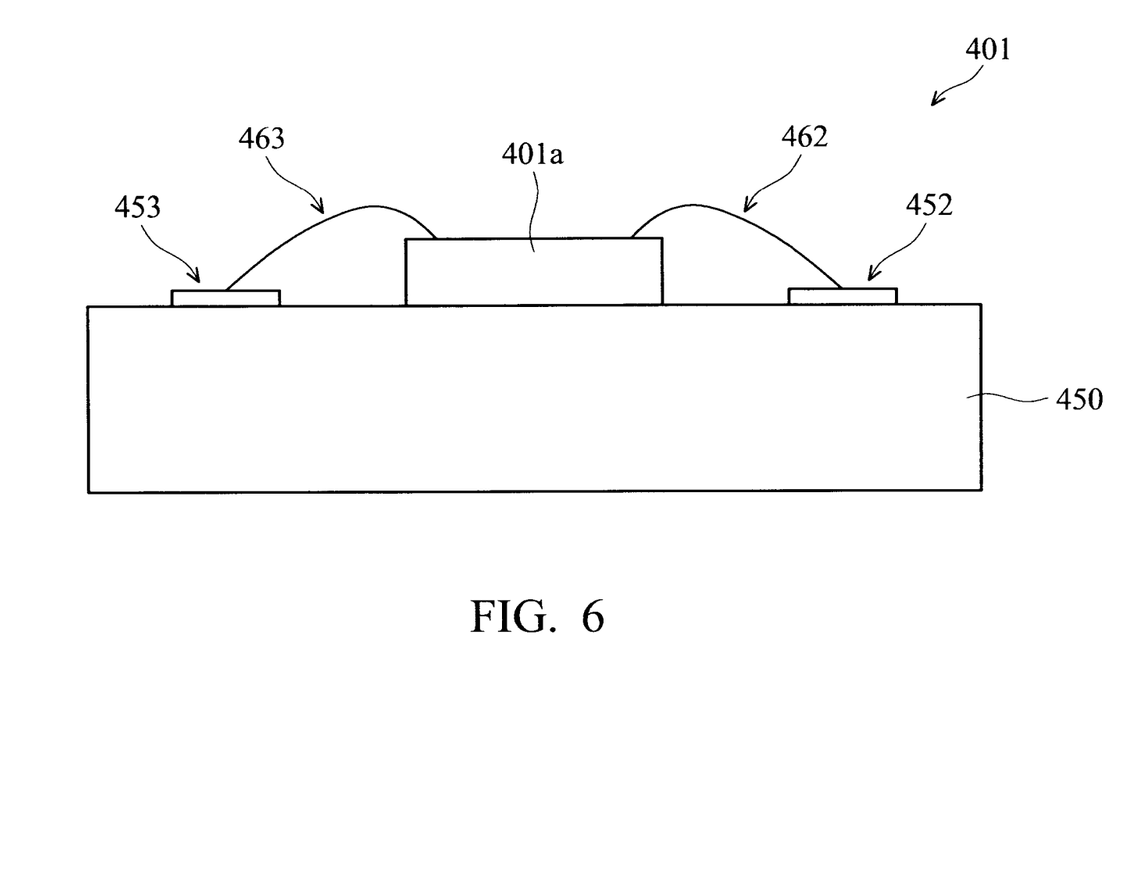
FIG. 6 is an illustration of one exemplary die region according to one embodiment.

The LED devices exemplified by LED 401*a* may also include electrodes or contacts that allow the LED devices to be electrically coupled to external devices. FIG. 6 is an illustration of exemplary LED 401*a* mounted or formed upon exemplary substrate 450. LED die region 401 is shown by itself, rather than with the other die regions of LED module 400 for ease of illustration, and it is understood that the explanation of FIG. 6 applies equally to the other LED die regions of LED module 400.

In FIG. 6, LED 401*a* is shown mounted upon substrate 450. Substrate 450 includes electrical contact pads 452, 453, which may be considered as a part of the LED die region 401. The contact pad 452 includes a metal material and serves as a contact electrode (for example, as an N-contact electrode) for the LED 401*a*. Similarly, the contact pad 453 also includes a metal material and serves as a contact electrode (for example, as a P-contact electrode) for the LED 401*a*.

LED 401*a* is in electrical contact with electrical contact pads 452, 453 using bond wires 462, 463. The bonding wires 462, 463 may include a metal material such as copper, aluminum, gold, an alloy, or combinations thereof. Electrical current may be applied to LED 401*a* using bond wires 462, 463 and electrical contact pads 452, 453. Electrically contacting the LEDs to the die regions using wire bonding is shown as block 108 of FIG. 1.

It is understood that processes for manufacturing the LEDs themselves (exemplified by LED 401*a*) may be performed at the wafer level by forming the LEDs on the LED module or may be performed one-by one by forming the LEDs separately and then mounting the LEDs on the LED module. Furthermore, the processes for mounting the LEDs to the substrate and wire bonding the LEDs to electrical contact pads on the die regions may be performed at the wafer level.

Returning to FIG. 1, in block 110 an adherent glue is drawn on the LED module between adjacent ones of the LEDs. In this example, the adherent glue may or may not be transparent, and the adherent glue is selected mainly for its ability to adhere lens board 200 to the surface of LED module 400. The adherent glue is applied in an amount adequate to adhere lens board 200 to LED module 400 but not so much as to cause a great amount of excess glue in the process.

Figure 7:
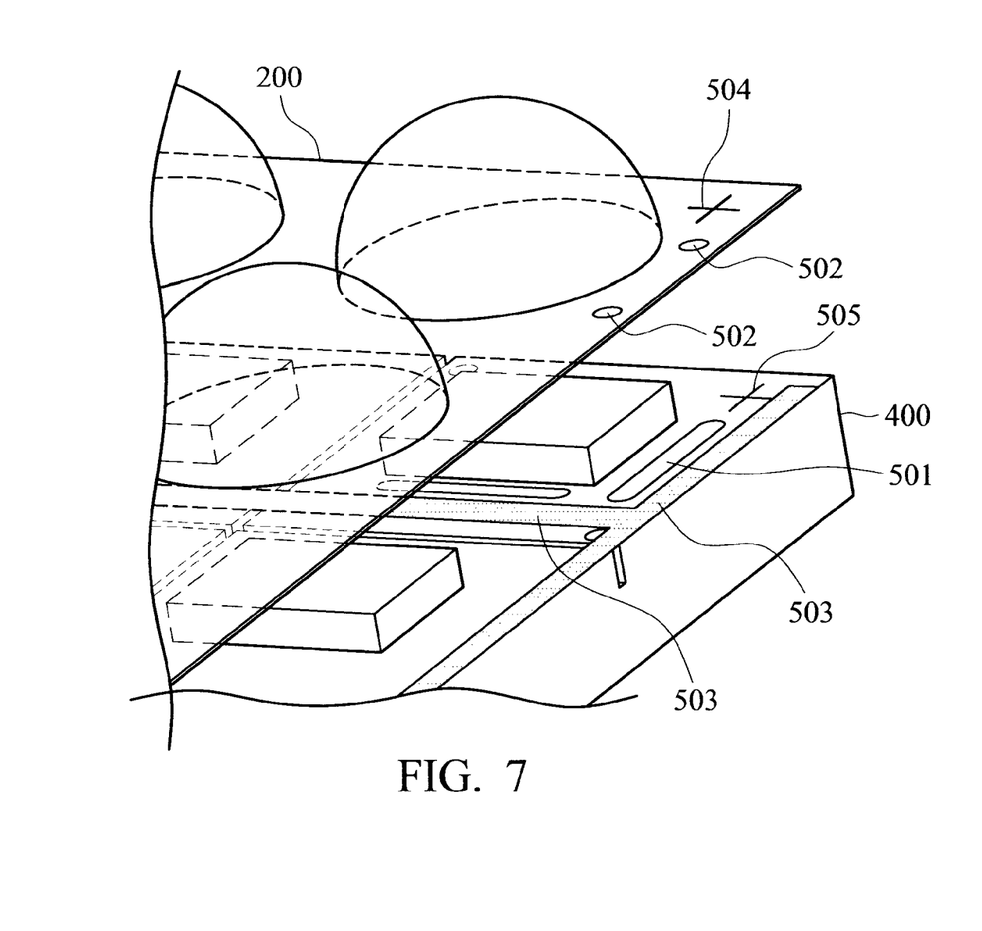
FIG. 7 is an illustration of a portion of a LED module and a lens mold being aligned during an adhering process.

In block 112, lens board 200 is adhered to LED module 400. FIG. 7 is an illustration of a portion of LED module 400 and lens board 200 being aligned during the adhering process of block 112. Adherent glue 501 is shown next to channels 503. During the adhering process, excess glue is removed by channels 503 and by via holes 502. As explained above, the optical glue is applied in an amount adequate to eliminate air bubbles in the microlenses, the excess being removed by channels 503 and via holes 502.

Figure 8:
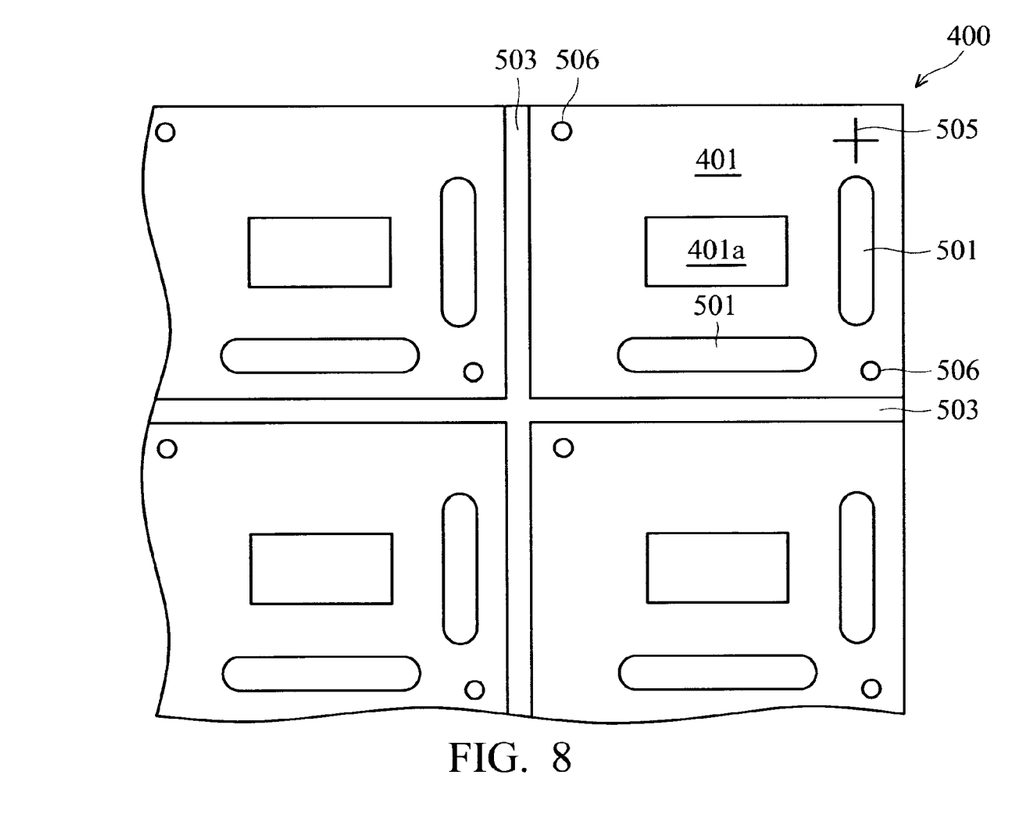
FIG. 8 is a top-down illustration of a portion of the exemplary LED module of FIG. 5.

FIG. 8 is an illustration of a portion of LED module 400 shown in a simplified view to show in more detail the adherent glue 501, channels 503, and via holes 506 in LED module 400. FIG. 8 is a top-down view showing four die regions of LED module 400 and some of the features thereon. The following description focuses on die region 401, and it is understood that the features discussed herein apply to the other die regions as well.

Adherent glue 501 is applied to LED module 400, in one example, as shown in FIG. 8, where it is placed near the periphery of die region 401. However, other embodiments may draw adherent glue 501 in any pattern desired, such as on all four edges of each die region, on only one edge of each die region, closer or farther from the center of the die region, etc.

In addition to the via holes 502 in lens board 200 (FIG. 2), the structure also includes via holes 506 in LED module 400. Channels 503 include scored areas between the individual die regions that may be created by, e.g., dry etching, sawing, and/or the like. As lens board 200 and LED module 400 make contact, adherent glue 501 is pressed between lens board 200 and LED module 400 and spreads out laterally. The optical glue in the microlens is also pressed between lens board 200 and LED module 400, and it spreads out laterally as well. Channels 503 assist in catching some of the excess glue (both optical glue, as well as adherent glue 501). The volume in the channels 503 is filled, at least partially, with the excess glue. Since the excess glue is removed from between lens board 200 and LED module 400, lens board 200 and LED module 400 fit together more closely than if the excess glue was allowed to remain on the surface of LED module 400.

Additionally, via holes 502 (FIG. 7) remove excess glue as well. Specifically, as the glue spreads out laterally between lens board 200 and LED module 400, some of the excess that is not trapped by channels 503 fills vias 502 at least partially.

The arrangement of vias 502, 506 and channels 503 is exemplary. Other embodiments may have bigger channels or smaller channels. Furthermore, other embodiments may have bigger vias or smaller vias or may place vias in different places than is shown in FIGS. 7 and 8. A given embodiment may have any configuration of vias and channels as desired to provide an expected amount of excess glue removal.

Effective excess glue removal may provide advantages. For example, effective excess glue removal allows for a more precise fit between lens board 200 and LED module 400. Additionally, effective excess glue removal may also help to prevent or minimize an amount of glue that escapes to the edge of LED module 400 and threatens to come into contact with other LED modules or machinery during manufacture.

Figure 9:
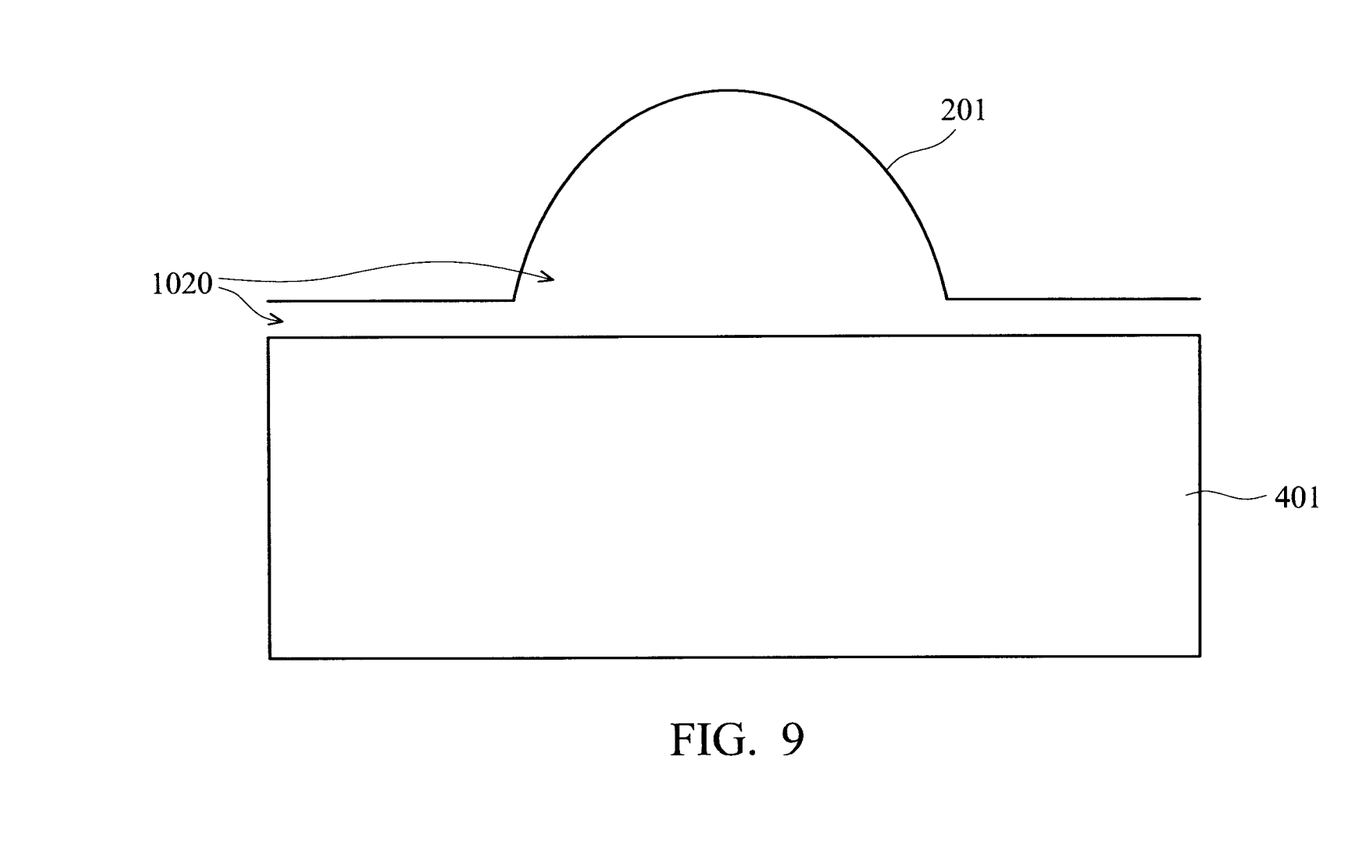

FIG. 9 shows a side view of an exemplary LED package according to an embodiment of the disclosure. FIG. 9 illustrates the relationship between the glue (both the optical glue and adherent glue 501), microlens 201, and LED die region 401 after dicing. In this example, only a single die 401 is shown, and it is understood that the discussion applies equally to other die packages after dicing in block 114.

As explained above, as LED module 400 and lens board 200 come into contact, the optical glue 301 (FIG. 4) and the adherent glue 501 spread out laterally between lens board 200 and LED module 400. In FIG. 9, glue layer 1020 is between microlens 201 and LED die 401. As the glue spreads out to form glue layer 1020 air is not trapped to form bubbles or irregularities in layer 1020. Layer 1020 forms a water-tight and air-tight seal between microlens 201 and LED die 401, thereby protecting LED die 401 and ensuring reliability.

Various embodiments may make glue layer 1020 as thin or as thick as desired for a given application. Variables that may be adjusted to achieve a desired thickness of glue layer 1020 include amount of glue, size and placement of via holes, and size and placement of channels.

Further in block 112 (FIG. 1), alignment marks 504, 505 are used to ensure that each of the lenses lines up with its respective LED die region. In this example, a fabrication machine uses an optical technique to align the marks 504, 505, though other embodiments may use other techniques. As lens board 200 is aligned with LED module 400, the LED module 400 and the lens board 200 make contact, and the adherent glue provides a bond holding the two components 200, 400 together. The actions of block 112 may be performed before or after the optical glue has cured.

Figure 10:
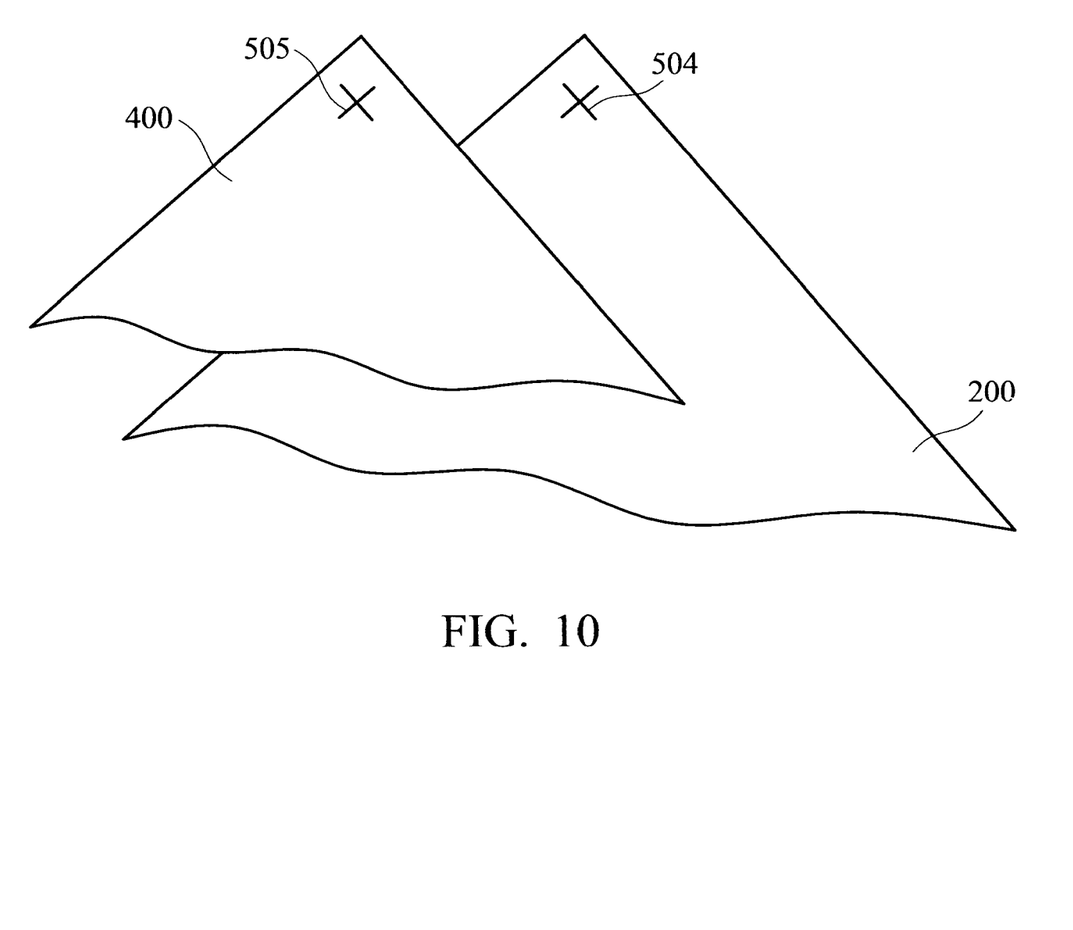
FIG. 10 is an illustration of an alignment process for aligning the LED module of FIG. 5 and the lens board of FIG. 2 according to one embodiment.

FIG. 10 shows LED module 400 being aligned with lens board 200. Various embodiments perform alignment according to one or more alignment techniques. FIG. 10 shows an example alignment technique in a top-down perspective view, wherein LED module 400 includes alignment marker 505, and lens board 200 includes alignment marker 504. A computer-controlled manufacturing machine uses infrared sensor technology to "see" alignment marks 504 and 505 and employs a feedback loop to precisely align LED module 400 and lens board 200 using alignment marks 504, 505. In another example, the computer-controlled manufacturing machine uses a Charge Coupled Device (CCD) as a sensor to see alignment marks 504, 505 with visible light. The scope of embodiments is not limited to any particular technique for aligning LED module 400 and lens board 200, as long as the technique employed provides sufficient precision to line up the microlenses and LED die regions as shown in FIG. 10.

Dicing and sorting is performed to separate the individual LED emitters at block 114 (FIG. 1). In this example, an LED emitter includes an LED die and its microlens. Any dicing/sorting technique now known or later developed may be employed in block 114. In one example, the dicing process includes an etching process, such as a dry etching process known in the art. In another example, the dividing process includes a non-etching process where a cutting device, such as a laser beam or a saw blade, is used to physically separate the LED emitters.

The dicing process may also include two stages of dividing, in which the LED emitters are partially divided after a first stage of dividing. In an embodiment, the first stage of dividing ends before the substrate is divided. At this point, preliminary wafer probing or testing may be performed on the LED emitters. A second stage of dividing is then performed to fully divide the LED emitters from one another. After the completion of the second stage of dividing, each of the LED emitters is capable of generating light and is physically and electrically independent from one another.

Further processing steps may include applying solder bumps (not shown) to each of the LED emitters. In one example, solder bumps include conductive materials that melt when heated, such as a lead-based material. The solder bumps may also include lead-free materials in alternate embodiments. The solder bumps are formed by a mechanical tool suitable for solder deposition. The solder bumps are typically formed after the LED emitters are separated from each other, but may be formed during or before the separation. For example, the solder bumps may be formed after a first stage of dividing before the LED emitters are completely separated from each other. Other steps may include mounting and/or packaging of the emitters.

Figure 11:
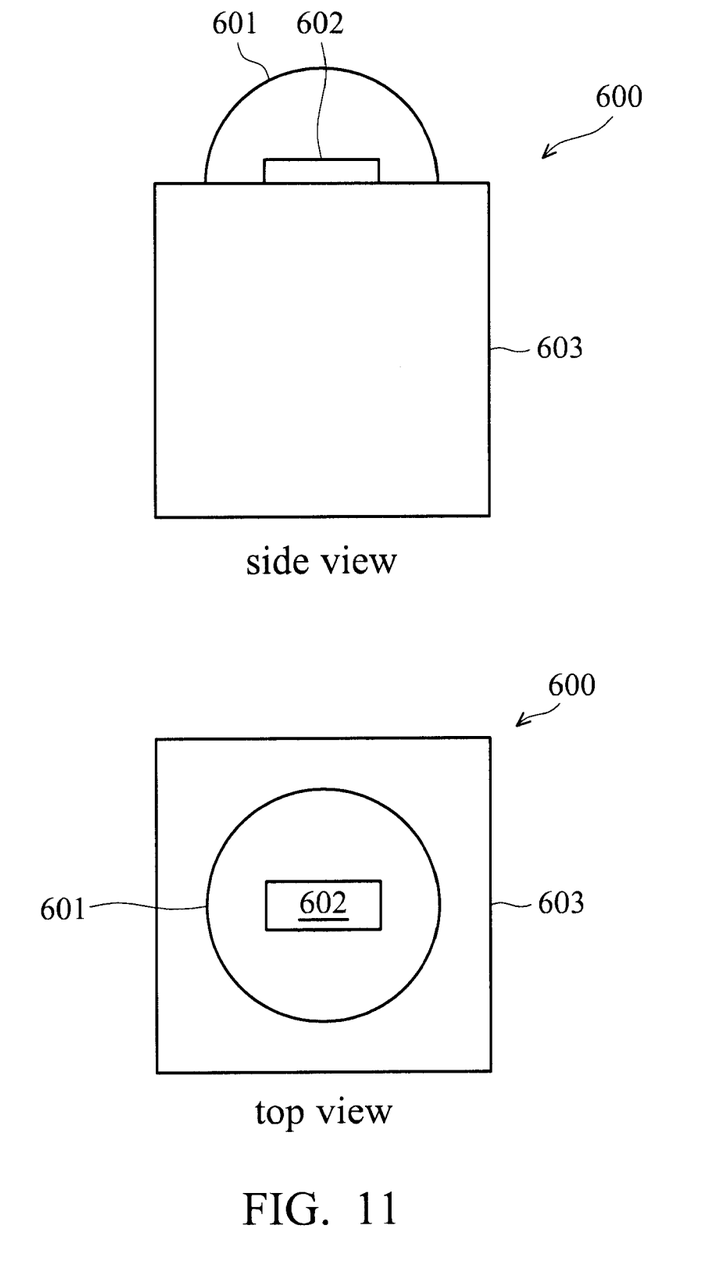
FIG. 11 shows an exemplary emitter adapted according to one embodiment.

FIG. 11 shows an exemplary emitter 600 adapted according to one embodiment. Emitter 600 may also be referred to as an LED package in some instances. Emitter 600 has been separated from adjacent emitters after dicing and displays a side view and a top view. FIG. 6 provides a view of microlens 601, LED 602, and substrate 603.

The microlens 601 directs and focuses the light emitted from the emitter 600 along the desired propagating direction. Microlens 601 is shown as hemispherical and centered above LED 602, though the scope of embodiments is not so limited. In another embodiment, microlens 601 may be positioned in a different desired alignment with respect to LED 602 and may have a different desired shape depending on a refractive index of material used for microlens 601 and distance from LED 602.

Figure 12:
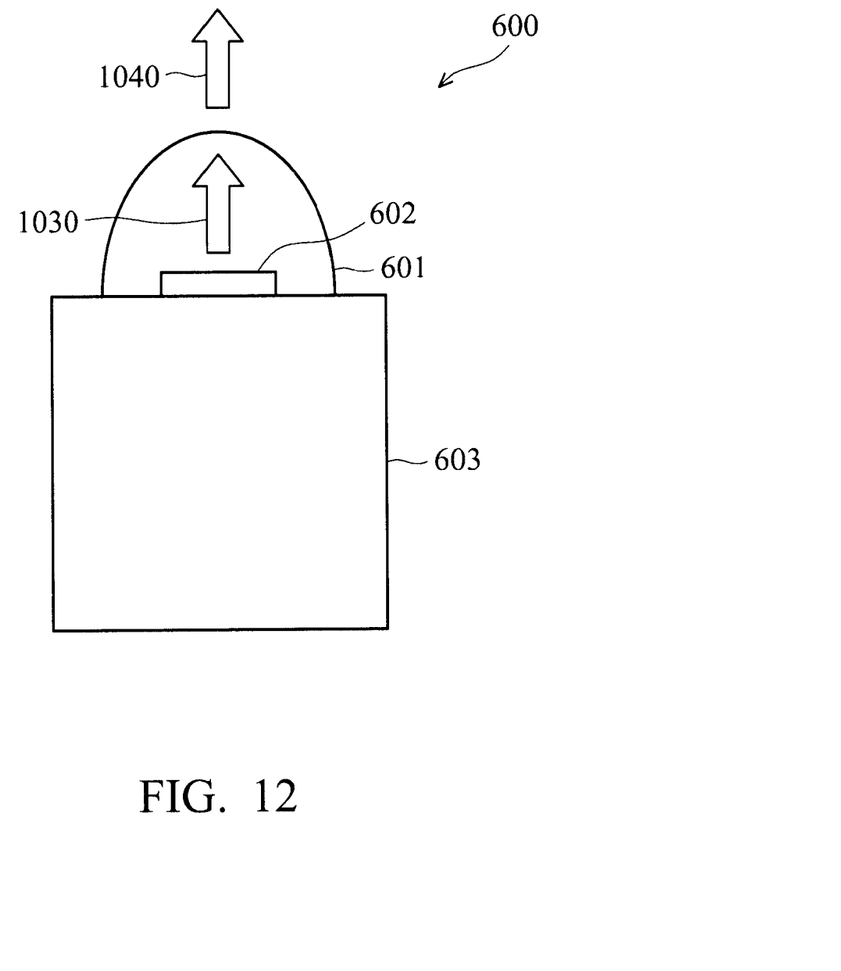
FIG. 12 shows the exemplary emitter of FIG. 11 with exemplary light rays illustrated according to one embodiment

FIG. 12 is an illustration of exemplary emitter 600 in a side view to illustrate light propagation according to an embodiment of the disclosure. During use, current is established across the junction of LED 602 to produce light 1030. Light 1030 propagates from LED 602, which is encapsulated by microlens 601. Microlens 601 has phosphor embedded in its material or otherwise applied to it, so that light 1030 interacts with the phosphor. The phosphor absorbs photons of light 1030 and emits light 1040, which may be of a different wavelength than light 1030. While FIG. 12 shows light 1030, 1040 directed straight up, such illustration is drawn for convenience only. It is understood that real-world applications have light patterns of LED 602 and phosphor/microlens 601 that may be less directional or otherwise differ substantially.

Various embodiments may include one or more advantages over conventional techniques. In one example, all of the actions of FIG. 1 are performed by machine, whereas by contrast, some conventional techniques included hand-mixing of phosphor glue before the glue is applied. In this example, the phosphor is included in a machine-controlled injection molding process. Complete automation can be, in many instances, more efficient than a process that includes one or more manual actions.

In another aspect, various embodiments have increased efficiency as a product of using wafer-level processes to manufacture a batch of LED packages. For instance, rather than applying phosphorous and making lenses one-by-one, various embodiments perform these actions (and other actions) at the wafer level to create a wafer-level structure that has a multitude of LED die regions encapsulated by optical glue and thin, plastic lenses with phosphorous. The wafer-level structure can then be diced to separate the individual die packages. The efficiency is realized both in the number of steps performed (i.e., fewer total steps are performed for a given number of LED packages by virtue of performing some steps for a number of LED die regions concurrently) and in time (i.e., many wafer-level embodiments take less time for manufacturing a given number of LEDs by virtue of manufacturing multiple LED die regions concurrently).

In another aspect, the embodiments described above provide an LED emitter where the phosphor is included in a relatively thin microlens and is separated from the LED by the optical glue and no air gap. This configuration provides insulation for the phosphor, thereby ameliorating harshness of the thermal cycling of the LED. Thus, some embodiments provide greater reliability and higher phosphor conversion efficiency than conventional LED emitters that deposit phosphor directly on the LED. However, the scope of embodiments includes configurations where the phosphor material may not be included in the relatively thin microlens. For instance, some embodiments may include the phosphor on the LED, in the optical glue applied on the LED, or in some other structure (not shown) that is outside of the thin microlens.

In yet another aspect, some embodiments avoid using phosphor glue to coat the LED module, thereby accommodating precise alignment markers on the LED module. The precise alignment markers can be used to align the lens board and the LED module better than in conventional techniques. Furthermore, embodiments that include drawn glue and well aligned components may exhibit a higher degree of waterproofing than other conventional emitters.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for manufacturing a semiconductor structure, the method comprising:
providing a wafer with a plurality of light-emitting diodes (LEDs) disposed thereon;
providing a lens board having a plurality of microlenses;
filling the microlenses with an optical glue;
aligning the lens board with the wafer such that each microlens is aligned with a respective LED; and
thereafter placing the lens board over the wafer so that the LEDs are housed within the microlenses, respectively, the optical glue being disposed between the LEDs and the microlenses.

2. The method of claim 1, wherein the filling the microlenses and the placing the lens board are performed such that the optical glue forms an air-tight seal between the microlenses and the LEDs.

3. The method of claim 1, wherein the providing the lens board comprises distributing phosphor particles within the microlenses.

4. The method of claim 1, wherein the providing the lens board comprises applying phosphor particles to one or more surfaces of the microlenses.

5. The method of claim 4, wherein the one or more surfaces include inner surfaces of the microlenses.

6. The method of claim 1, wherein the providing the lens board comprises forming a plurality of via holes in portions of the lens board other than the microlenses.

7. The method of claim 1, further comprising: forming a plurality of recessed channels in portions of the wafer adjacent to the LEDs.

8. The method of claim 1, further comprising: securing the lens board to the wafer through an adhesive material applied to the wafer.

9. The method of claim 1, further comprising: dicing the wafer to singulate the LEDs, wherein the dicing is performed after the placing the lens board.

10. A method for manufacturing a plurality of light-emitting diodes (LEDs), the method comprising:
providing a wafer with a plurality of light-emitting diodes (LEDs) disposed thereon;
providing a lens board having a plurality of microlenses;
applying optical glue to the microlenses;
aligning each microlens with a respective LED; and
thereafter securing the lens board to the wafer in a manner such that each LED is covered by a respective microlens and the optical glue within the microlens, the optical glue providing an airtight seal for the LEDs; and thereafter dicing the wafer to singulate the LEDs.

11. The method of claim 10, wherein the providing the lens board comprises:

melting a plastic lens board material; and mixing phosphor particles within the melted plastic lens board material.

12. The method of claim 10, wherein the providing the lens board comprises forming a surface phosphor layer to cover selected portions of the lens board.

13. The method of claim 12, wherein the selected portions include inner surfaces of the microlenses.

14. The method of claim 10, wherein the securing the lens board is performed using an adherent glue.

15. The method of claim 14, wherein the providing the lens board comprises forming a plurality of via holes in portions of the lens board other than the microlenses, and wherein the securing the lens board comprises at least partially filling the via holes with excess optical glue and excess adherent glue.

16. The method of claim 14, further comprising: forming a plurality of recessed channels in portions of the wafer adjacent to the LEDs, and wherein the securing the lens board comprises at least partially filling the recessed channels with excess optical glue and excess adherent glue.

17. A method for manufacturing a plurality of light-emitting diodes (LEDs), the method comprising:

providing a wafer with a plurality of light-emitting diodes (LEDs) disposed thereon, the wafer containing a plurality of recessed channels adjacent to the LEDs;

providing a lens board having a plurality of microlenses, the lens board having a plurality of via holes;

applying optical glue to the microlenses;

aligning each microlens with a respective LED; and thereafter attaching, via an adherent glue, the lens board to the wafer in a manner such that each LED is covered by a respective microlens, wherein the vias and the recessed channels are at least partially filled with excess optical glue and adherent glue during the attaching; and thereafter dicing the wafer to singulate the LEDs.

18. The method of claim 17, wherein the providing the lens board comprises mixing phosphor particles in the microlenses via an injection molding process.

19. The method of claim 17, wherein the providing the lens board comprises applying phosphor particles to inner surfaces of the microlenses.

20. The method of claim 17, wherein the attaching is performed such that the optical glue forms an air-tight seal between the microlenses and the LEDs.

* * * * *